Aug. 12, 1958 HUNG CHANG LIN 2,847,583

SEMICONDUCTOR DEVICES AND STABILIZATION THEREOF

Filed Dec. 13, 1954

INVENTOR.
HUNG CHANG LIN
BY J. L. Whittaker
ATTORNEY

United States Patent Office 2,847,583

Patented Aug. 12, 1958

2,847,583

SEMICONDUCTOR DEVICES AND STABILIZATION THEREOF

Hung Chang Lin, Levittown, Pa., assignor to Radio Corporation of America, a corporation of Delaware Application December 13, 1954, Serial No. 474,679

13 Claims. (Cl. 307—88.5)

The present invention relates to semiconductor devices and systems and, in particular, to multi-electrode semiconductor devices and systems for compensating for changes in the operating conditions thereof due to changes in ambient temperature and in the internal temperature of the devices.

Semiconductor devices, such as transistor amplifiers, oscillators and the like, and particularly such semiconductor devices including a body of germanium, are highly temperature sensitive. These devices are normally subject to temperature variations arising from changes in the ambient temperature and further under certain conditions, to temperature changes within the semi-conductor devices. Temperature changes alter certain operating characteristics in varying degree. In particular, in a transistor including base, emitter and collector electrodes, the emitter-to-base bias voltage is seriously affected by changes in temperature. Various feedback and current stabilization systems and methods are known which are helpful in compensating for changes in ambient temperature but not, in addition, for temperature changes in the semiconductor devices themselves.

It is, therefore, an object of the present invention to provide a temperature-compensated semiconductor device of improved form and a circuit therefor.

It is another object of the present invention to provide an improved temperature-compensated semiconductor device and bias circuit for improving stability and efficiency of operation over a wide range of ambient and internal temperature variation.

In accordance with the principles and objects of this invention, a semiconductor device, to be stabilized against ambient and internal temperature variations, is provided with the appropriate bias voltages and, in addition, a temperature sensitive element is superimposed on a portion of one of the bias voltage paths. The temperature sensitive element is disposed in this path so that it appropriately alters the bias voltage provided thereby due to changes in ambient temperature. In addition, a portion of the temperature sensitive element is in direct contact with a portion of the semiconductor device so that compensation is also provided for changes in the temperature of the device due to internal effects.

In accordance with one embodiment of the present invention, a temperature sensitive element comprising a semiconductor diode is disposed with the emitter electrode integral with the emitter electrode of a semiconductor device, for example a triode transistor, to be protected. The diode and transistor are connected in separate circuits having a common portion between the emitter and base of the transistor. Thus, the diode is utilized to vary, as its temperature varies, the bias voltage between the base and emitter electrodes, of the transistor. Since the diode is in thermal contact with the semiconductor device, it compensates for both ambient and internal temperature changes.

In another embodiment of the present invention, a common base crystal or body is employed for both the diode and transistor.

The invention will be described in greater detail by reference to the accompanying drawing, in which.

Similar elements are designated by similar reference characters throughout the drawing.

Figure 1:
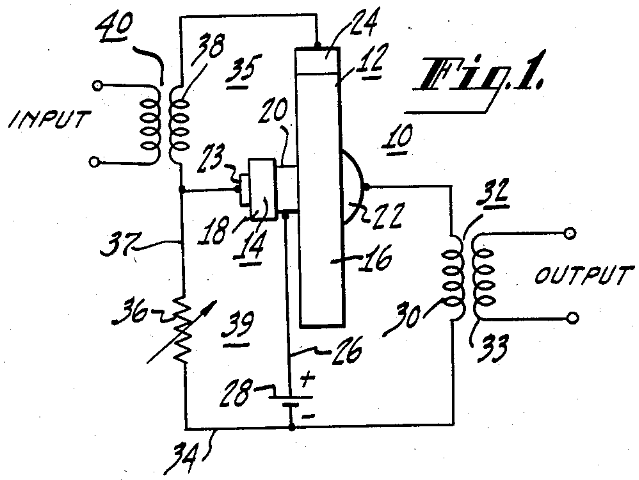
Fig. 1 is an elevational view of a device embodying the principles of the invention and a schematic circuit for use therewith.

Figure 1 includes a semiconductor device 10, in accordance with a first embodiment of the invention, wherein compensation for ambient and internal temperature changes are effected by employing, in an appropriate circuit, a device which includes, in a single package, a transistor amplifier portion 12 whose temperature is to be controlled, and a temperature-sensitive controlling device, for example, a semiconductor diode portion 14. The composite device 10 includes first and second crystals 16 and 18, respectively, preferably of the same or similar type of single-crystal semiconductor material, for example, germanium, silicon or the like of N-type or P-type conductivity. For the purposes of the present invention, the crystals will be assumed to be N-type germanium.

An electrode 20 is provided in rectifying contact with each of the semiconductor crystals 16 and 18 and is intended for operation as the input or emitter electrode for both the diode 14 and transistor 12.

The rectifying electrode 20 may be a surface barrier plate or film or it may be a P-N junction type electrode separated from the body of each of the crystals 16 and 18 by a P-N junction (not shown). P-N junction type electrodes may be formed by an alloying or fusion process of the type described in an article by Law et al. entitled "A developmental germanium P-N-P junction transistor" in the Proceedings of the IRE of November 1952. The crystal 16 of the transistor 12 is provided with a second P-N junction electrode 22, which is intended for operation as the collector electrode thereof. The diode and transistor are also each provided with a metal base electrode 23 and 24, respectively, in ohmic (non-rectifying) contact with the crystals 18 and 16, respectively.

The circuit of Figure 1 includes a lead 26 from the emitter electrode 20 which is connected to a source of reference potential, such as ground, and to the positive terminal of a bias voltage source such as a battery 28. The negative terminal of the battery 28 is connected to a load device, for example, to one end of the primary winding 30 of an output transformer 32, the other end of which is connected to the collector electrode 22. The secondary winding 33 of the output transformer 32 is connected to a suitable output circuit (not shown). A lead 34 from the negative terminal of the battery 28 is connected through an adjustable bias resistor 36 and a lead 37 to the base electrode 23 of the diode portion 14 of the device 10. The secondary winding 38 of an input signal transformer 40 is connected between the diode base electrode 23 and the transistor base electrode 24. Thus, the emitter electrode 20 is biased in the forward direction with respect to each of the semiconductor crystals and the transistor collector electrode 22 is biased in the reverse direction with respect to the transistor crystal 16.

The bias voltage circuit between the emitter electrode 20 and the base electrode 24 of the transistor portion 12 includes the lead 26, the battery 28, the lead 34, the resistance 36 and the winding 38. The temperature compensating diode is connected in a circuit loop 39 which includes between the emitter electrode 20 and base electrode 23, the lead 26, the battery 28, the lead 34 and the resistance 36.

The current flow in these circuits is determined by the value of the adjustable resistance 36 which is set, initially, to achieve the necessary current flow to provide the proper voltage drop across the diode 14 which in turn provides the desired emitter-to-base bias voltage for the transistor 12.

When the temperature of the diode changes either due to a change in ambient temperature or to a change in the internal temperature of the transistor, or both, the D. C. conductance of the diode changes. For example, if the temperature is increased, the D. C. conductance is increased. As the D. C. conductance of the diode changes, the voltage drop across the diode due to current flow in the circuit loop 39 changes and the transistor emitter-to-base bias changes correspondingly in the proper sense to maintain normal transistor operation. Thus, once the resistance 36 has been adjusted to establish the desired transistor emitter-to-base voltage, the proper transistor emitter bias is maintained automatically to compensate for the normal conductance variations due to temperature variation.

Figure 2:
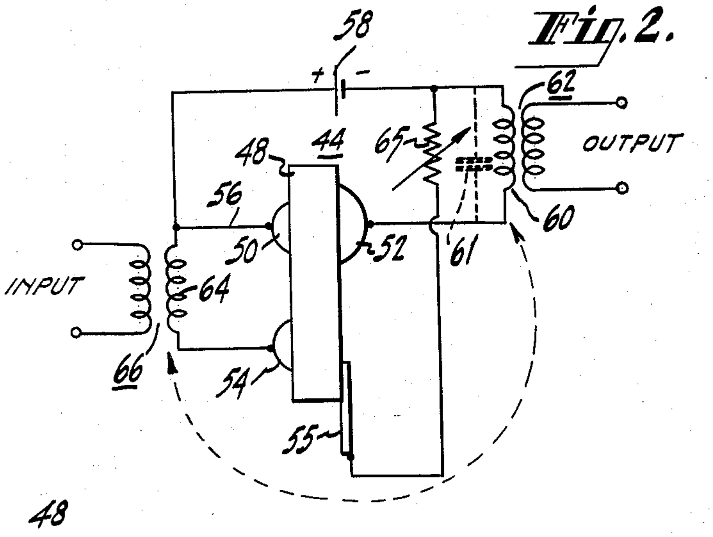
Fig. 2 is an elevational view of a modification of the device of Fig. 1 and a schematic representation of a circuit for use therewith.

Referring to Figure 2, in a modification of the invention, a composite device 44 includes a transistor and temperature control diode constructed on the same semiconductor crystal 48 whereby a common base region is employed. The semiconductor crystal 48, for example, of N-type germanium has, for the transistor portion emitter and collector rectifying electrodes for example, P-N junction electrodes 50 and 52, respectively. A third rectifying electrode 54 in close proximity to the emitter electrode 50 comprises the emitter of the temperature compensating diode portion of the device. The diode emitter 54 is closely thermally coupled to the emitter 50 so that it is sensitive to temperature changes in the transistor portion of the device. However, the emitter 54 is positioned farther than a diffusion length for minority charge carriers away from the emitter 50. Diffusion length $L=\sqrt{Dt}$, where $D$=diffusion constant and $t$=lifetime. A base electrode 55 is in ohmic (non-rectifying) contact with the crystal 48 at substantially any desired location.

The circuit of Figure 2 includes a lead 56 from the transistor emitter electrode 50 to the positive terminal of a bias voltage source such as a battery 58. The negative terminal of the battery 58 is connected to one end of the primary winding 60 of an output signal transformer 62. The other end of the primary winding 60 is connected to the collector electrode 52. The negative terminal of the battery 58 also is connected through an adjustable bias resistance 65 to the base electrode 55. The emitter electrode 50 of the transistor also is connected through the secondary winding 64 of a signal input transformer 66 to the emitter electrode 54 of the temperature-compensating diode portion.

In the circuit of Figure 2, the transistor emitter-to-base bias voltage loop circuit includes the emitter electrode 50, the lead 56, the battery 58, the resistance 65 and the base electrode 55.

The current flow loop of the diode portion of the device 44 includes the emitter electrode 54, the winding 64, the battery 58, the resistance 65 and the base electrode 55. Thus, it is seen that the transistor emitter-to-base circuit and the diode circuit have a common portion including the battery 58, the resistance 65 and the base electrode 55. As shown in Figure 2 the signal input circuit of the transistor comprises a series loop which includes the secondary winding 64 of the signal input transformer 66, the forward biased diode portion of the device 44, and the base 55 to emitter 50 path of the transistor. Signals applied to the signal input transformer 66 are fed through diode portion of the device 44 to the base electrode 55 which is common to both the diode portion and the transistor portion of the device 44. The forward biased diode portion thus furnishes a low impedance path connecting the signal input transformer 66 to the base 55 to emitter 50 portion of the transistor.

Since the resistance 65 is selected to be comparatively large, substantially constant current will flow in the diode loop circuit, and the resultant voltage across the diode will be determined by the D. C. conductance and the temperature of the diode. If the ambient temperature and/or the temperature of the crystal 48 due to current flow in the transistor, change the voltage drop across the diode will change, as described above and, since the emitter of the diode is connected in circuit with the emitter 50 of the transistor, a change in the voltage across the diode results in a change in the bias between the emitter and base electrode of the transistor as required for temperature vs. conductance compensation.

It should be understood that the signal amplifying arrangements described are intended only to be illustrative of the application of the invention. The temperature compensating features of the invention also are equally applicable to other signal circuits incorporating the transistor portion, such for example as oscillators, modulators, detectors, or other signal translating circuits. For example, referring to Figure 2, if a tuning capacitor 61 is connected across the winding 60 and the winding 60 is coupled to the winding 64, as shown in Figure 2, oscillator operation is achieved and temperature compensation thereof is also provided as described above.

Figure 3:
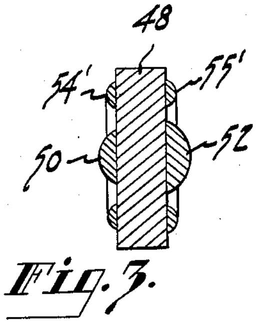
Fig. 3 is a sectional elevational view of a first modification of the device of Fig. 2; and, Fig. 4 is a sectional elevational view of a second modification of the device of Fig. 2.
Figure 4:
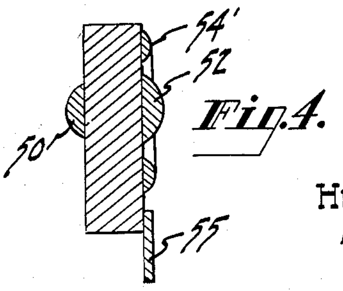

Various modifications may be made in the configuration of the various portions of the devices described above to illustrate the principles of the invention. For example, ring electrodes may be employed where appropriate as shown in Figure 3 wherein the diode emitter electrode 54 of Figure 2 is in the form of a ring 54′ around the emitter 50. The emitter ring 54′ may also be coaxial with the collector 52 as shown in Figure 4 and in close thermal relation therewith while more than a diffusion length for minority charge carriers therefrom. The base electrode 55 of Figure 2 may be in the form of a ring 55′ around the collector 52 as in Figure 3 or it may surround the emitter 54.

What is claimed is:

1. Semiconductor apparatus comprising a first semiconductor device having a semiconductor crystal and emitter, collector and base electrodes, a bias voltage circuit loop connected between said emitter and base electrodes, and a temperature-sensitive semiconductor diode including a semiconductor crystal, base and emitter electrodes and having a circuit loop a portion of which is common with a portion of said bias voltage circuit loop, said emitter electrodes being in direct contact with each other whereby compensation is provided for changes in the operating conditions of said first device due to ambient and internal temperature variations.

2. Semiconductor apparatus comprising a first semiconductor device having a semiconductor crystal and emitter, collector and base electrodes, a bias voltage circuit loop connected between said emitter and base electrodes, and a temperature-sensitive semiconductor diode including a semiconductor crystal, base and emitter electrodes and having a circuit loop a portion of which is common with a portion of said bias voltage circuit loop, said emitter electrodes being it direct contact whereby compensation is provided for changes in the operating conditions of said first device due to ambient and internal temperature variations and a common bias voltage source coupled to all of said electrodes.

3. Semiconductor apparatus comprising a first semiconductor device having a semiconductor crystal and emitter, collector and base electrodes, and a temperature-sensitive semiconductor diode including a semiconductor crystal, base and emitter electrodes, said emitter electrodes having portions thereof in direct contact with each other, means for applying a reference bias voltage to said emitter electrode of said first semiconductor device with respect to said base electrode thereof, means for deriving from said diode a compensating bias voltage which varies in response to temperature changes occurring therein, and means for applying said compensating voltage to said emitter and base electrodes of said first semiconductor device, whereby compensation is provided for changes in the operating conditions of said first device due to ambient and internal temperature variations.

4. Semiconductor apparatus including a first semiconductor device having semiconductor crystal base, emitter and collector portions, and a second semiconductor device having semiconductor crystal base and emitter portions, a portion of each of said devices being in direct contact with the respective portion of the other, means for applying a voltage to said emitter portion of said first semiconductor device with respect to said base portion thereof, means for deriving from said second device a compensating bias voltage which varies in respect to temperature changes occurring therein, and means for applying said compensating voltage to said emitter and base portions of said first semiconductor device.

5. The apparatus defined in claim 4 including a common source of bias voltage connected to the emitter portions of both said semiconductor devices.

6. The apparatus defined in claim 4 wherein said base, emitter, and collector portions of said first semiconductor device include base, emitter and collector electrodes respectively, said base portions of said second semiconductor device including said base electrode, said emitter portion of said second semiconductor device including a second emitter electrode, and wherein that portion of each of said devices which is in direct contact with the respective portion of the other comprises the semiconductor crystal portion of each of said devices, each of said crystal portions being an integral part of a common semiconductor crystal body.

7. The apparatus defined in claim 6 and including a common bias voltage source coupled to the emitter electrodes of both of said semiconductor devices.

8. The apparatus defined in claim 6 wherein said emitter electrodes are in close thermal relationship and separated a distance greater than a diffusion length for minority charge carriers in said semiconductor crystal body.

9. The apparatus defined in claim 6 wherein said emitter electrodes are coaxially disposed in close thermal relationship and separated a distance greater than a diffusion length for minority charge carriers in said semiconductor crystal body.

10. The apparatus defined in claim 6 wherein said base electrode and said second emitter electrode are ring-shaped and said emitter electrodes are coaxially disposed in close thermal relationship and are separated a distance greater than a diffusion length for minority carriers in said semiconductor crystal body.

11. The apparatus defined in claim 6 wherein said base electrode and said second emitter electrode are ring-shaped, said collector electrode and said base electrode being coaxially aligned, and said emitter electrodes also being coaxially aligned.

12. The apparatus defined in claim 6 wherein said second emitter electrode is ring-shaped, said second emitter electrode and said collector electrode being coaxially disposed in close thermal relationship and separated a distance greater than a diffusion length for minority charge carriers in said semiconductor crystal body.

13. The apparatus defined in claim 6 wherein said second emitter electrode is ring-shaped, said second emitter electrode and said collector electrode being coaxially disposed in closed thermal relationship and separated a distance greater than a diffusion length for minority carriers in said semiconductor crystal body.

References Cited in the file of this patent

UNITED STATES PATENTS

| | | |
|---|---|---|
| 2,622,211 | Trent | Dec. 16, 1952 |
| 2,624,016 | White | Dec. 30, 1952 |
| 2,676,271 | Baldwin | Apr. 20, 1954 |
| 2,702,838 | Haynes | Feb. 22, 1955 |
| 2,717,342 | Pfann | Sept. 6, 1955 |